(12) United States Patent
Kang (10) Patent No.: US 9,508,557 B2
(45) Date of Patent: Nov. 29, 2016

(54) METHOD OF IMPROVING LINE ROUGHNESS IN SUBSTRATE PROCESSING

(71) Applicant: Tokyo Electron Limited, Minato-ku, Tokyo (JP)

(72) Inventor: Hoyoung Kang, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/676,356

(22) Filed: Apr. 1, 2015

(65) Prior Publication Data

US 2016/0148812 A1 May 26, 2016

Related U.S. Application Data (60) Provisional application No. 62/083,585, filed on Nov. 24, 2014.

(51) Int. Cl.
| | |
|---|---|
| H01L 21/304 | (2006.01) |
| H01L 21/027 | (2006.01) |
| H01L 21/324 | (2006.01) |
| H01L 21/311 | (2006.01) |
| H05B 3/22 | (2006.01) |
| H01L 21/687 | (2006.01) |
| H01L 21/302 | (2006.01) |
| H01L 21/3065 | (2006.01) |
| H01L 21/67 | (2006.01) |
| H01L 21/677 | (2006.01) |

(52) U.S. Cl.
CPC ......... *H01L 21/304* (2013.01); *H01L 21/0273* (2013.01); *H01L 21/302* (2013.01); *H01L 21/3065* (2013.01); *H01L 21/31111* (2013.01); *H01L 21/324* (2013.01); *H01L 21/67109* (2013.01); *H01L 21/67748* (2013.01); *H01L 21/68735* (2013.01); *H05B 3/22* (2013.01)

(58) Field of Classification Search
None
See application file for complete search history.

(56) References Cited

U.S. PATENT DOCUMENTS

| | | | |
|---|---|---|---|
| 6,184,157 B1 | 2/2001 | Hsu et al. | |
| 6,906,393 B2 | 6/2005 | Sayama et al. | |
| 7,381,451 B1 | 6/2008 | Lang et al. | |
| 7,781,276 B2 * | 8/2010 | Lee | H01L 21/82380 257/229 |
| 2009/0124093 A1 | 5/2009 | Lee et al. | |
| 2010/0081285 A1 * | 4/2010 | Chen | G03F 7/40 438/710 |
| 2014/0017903 A1 | 1/2014 | Bello et al. | |

* cited by examiner

*Primary Examiner* — Jiong-Ping Lu
(74) *Attorney, Agent, or Firm* — Wood Herron & Evans LLP (57) ABSTRACT

Provided is a method for processing a semiconductor substrate to reduce line roughness, the method comprising: positioning a substrate in a film-forming system, the film-forming system comprising a chuck having a clamping mechanism configured to hold the substrate in a processing chamber and flex the substrate by displacing a center of the substrate relative to a peripheral edge of the substrate so as to create a concave surface during processing; coating the substrate with a layer of material; performing a post apply bake process; flexing the substrate to create the concave surface either during the post apply bake or following the post apply bake process, wherein the concave surface has a degree of concavity measured at the center of the substrate that exceeds a base number of microns; and unflexing the substrate and inducing tensile stress in the layer of material on the substrate.

19 Claims, 10 Drawing Sheets

METHOD OF IMPROVING LINE ROUGHNESS IN SUBSTRATE PROCESSING

CROSS-REFERENCE TO RELATED APPLICATIONS

Pursuant to 37 C.F.R. §1.78(a)(4), this application claims the benefit of and priority to prior filed co-pending Provisional Applications Ser. No. 62/083,585 filed on Nov. 24, 2014, which is expressly incorporated herein by reference.

BACKGROUND OF THE INVENTION

1. Field of Invention

The invention is related to methods and systems for substrate processing and more specifically to methods and systems for reducing line roughness.

2. Description of Related Art

Patterns are used to make structures on a substrate to make a device for use in semiconductor applications. Patterns have stochastic variations that appear as line edge roughness or line width changes. Line edge roughness, as well as line width roughness, limits the quality of the end product semiconductor device.

Most film deposition tools or curing tools are typically configured to make the substrate as flat as possible. If the film or layer creates tensile stress as a result of processing, then there are no serious issues with line edge roughness. However, many films or layers create compressive stress on silicon. When those films or layers are etched to make fine patterns for semiconductor devices, these films or layers tend to show "wiggling", which are variations from the ideal line and space pattern of structures. When the variations or line roughness become substantial, line roughness can affect the performance of the device in the semiconductor application. Thus, there is a need for systems and methods to reduce the line roughness during film or layer patterning or curing processes.

SUMMARY OF THE INVENTION

Provided is a method for processing a semiconductor substrate to reduce line roughness, the method comprising: positioning a substrate in a film-forming system, the film-forming system comprising a chuck having a clamping mechanism configured to hold the substrate in a processing chamber and flex the substrate by displacing a center of the substrate relative to a peripheral edge of the substrate so as to create a concave surface during processing; coating the substrate with a layer of material; flexing the substrate to create the concave surface either during the coating or following the coating, wherein the concave surface has a degree of concavity measured at the center of the substrate that exceeds a base number of microns; and unflexing the substrate and inducing tensile stress in the layer of material on the substrate.

In another embodiment, provided is a method for processing a semiconductor substrate, the semiconductor having a structure, the structure having a line roughness, the method configured to improve line roughness, the method comprising: positioning a substrate in a track system, the track system comprising a concave chuck configured to hold a substrate in a track system chamber; depositing a spacer layer on the substrate; flexing the substrate to create the concave surface either during the deposition or following the deposition, wherein the concave surface has a degree of concavity measured at the center of the substrate that exceeds a base number of microns; and unflexing the substrate and inducing tensile stress in the layer of material on the substrate; the degree of concavity is from a range of 150 to 200 μm or the degree of concavity is less than 1 micron per millimeter of diameter length of the substrate, or the degree of concavity is varied according the diameter of the substrate and historical data acquired for processing the layer of material; and wherein the target reduction in line roughness is 4 to 6 nm of 3 sigma ($3\sigma$).

Also provided is a film-forming system comprising: a processing chamber for processing a substrate; a chuck coupled to the processing chamber, the chuck having a clamping mechanism, the clamping mechanism configured to: hold the chuck in the processing chamber and flex the substrate to create the concave surface either during the deposition or following the deposition, wherein the concave surface has a degree of concavity measured at the center of the substrate that exceeds a base number of microns; and unflex the substrate and induce tensile stress in the layer of material on the substrate; wherein the film-forming system is one of a spin-on deposition system or a vapor deposition system, wherein the clamping mechanism is one of an electrostatic device or a vacuum device; and wherein the processing chamber is at least one of a spin-on coating chamber, or a vapor deposition chamber, or an etching chamber. A base number of microns can be at least 150 μm.

BRIEF DESCRIPTION OF THE DRAWINGS

FIG. 1A depicts an exemplary prior art cross-sectional view of material layer(s) on a substrate during deposition or curing while

FIG. 2A depicts an exemplary cross-sectional view of layers of a substrate during deposition or curing while

FIG. 3A depicts an exemplary top-view of structures in a tensile to a neutral stress layer on a substrate while

FIG. 4A depicts a schematic of a substrate on a concave chuck and a clamping device illustrating the degree of concavity with the substrate disposed above the chuck whereas

FIG. 7A depicts a schematic for a film-forming system for improving the line roughness utilizing flexing techniques of the present invention using a substrate in the cooling chamber while

DETAILED DESCRIPTION

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "radiation sensitive material" means and includes photosensitive materials such as photoresists. In this specification, the terms layer and film shall mean the same.

"Substrate" as used herein generically refers to the object being processed in accordance with the invention. The substrate may include any material portion or structure of a device, particularly a semiconductor or other electronics device, and may, for example, be a base substrate structure, such as a semiconductor substrate or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

Line edge roughness can be improved with induced tensile stress of patterning materials. The layer of material on the substrate can be processed during or after deposition, curing, or baking systems to have tensile stress. Inducement of tensile stress in the layer of material requires several steps. The layer of material which is in a compressive stress, no stress, or tensile stress state, must be in a compressive stress state. To do this, the substrate needs to be in concave shape during deposition, curing, or baking process. In an embodiment, the substrate can be converted into a concave shape by flexing the substrate against a chuck or hot plate that has a concave shape. During deposition, curing, or baking, the substrate is kept in a concave shape and the stress in the film deposited or cured will become or remain as a compressive stress film. When the substrate undergoes the unflexing operation, the substrate will go back to a flat shape or near zero degree of concavity. During the unflexing operation, the film is induced to have tensile stress regardless of the type of stress that was present in the film before the flexing and unflexing operations.

Figure 1A:
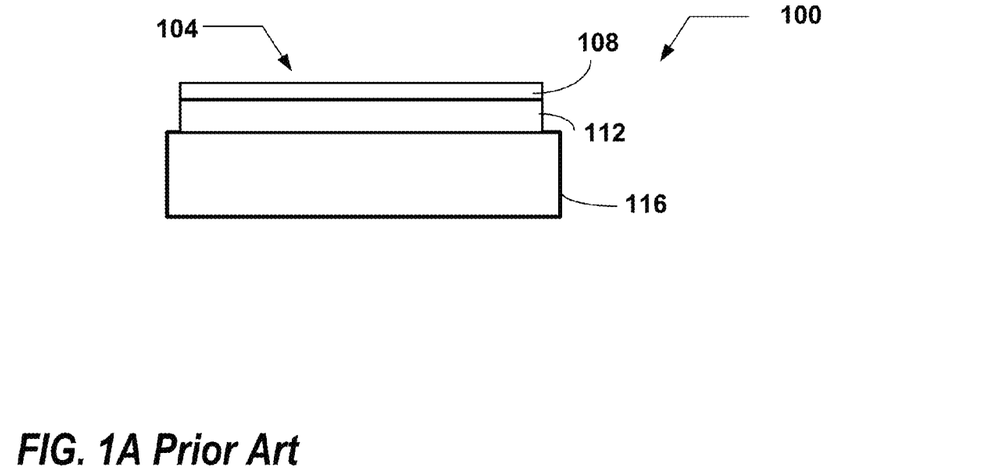

FIG. 1A depicts an exemplary prior art cross-sectional view of a film-forming system 104 of a film 108 on a substrate 112 during a deposition or curing. The deposited film 104 on the substrate 108 that is disposed on top of a chuck 116 with the deposited film 108 having no tensile stress. The chuck 116 is substantially flat, i.e. with a degree of concavity of zero.

Figure 1B:
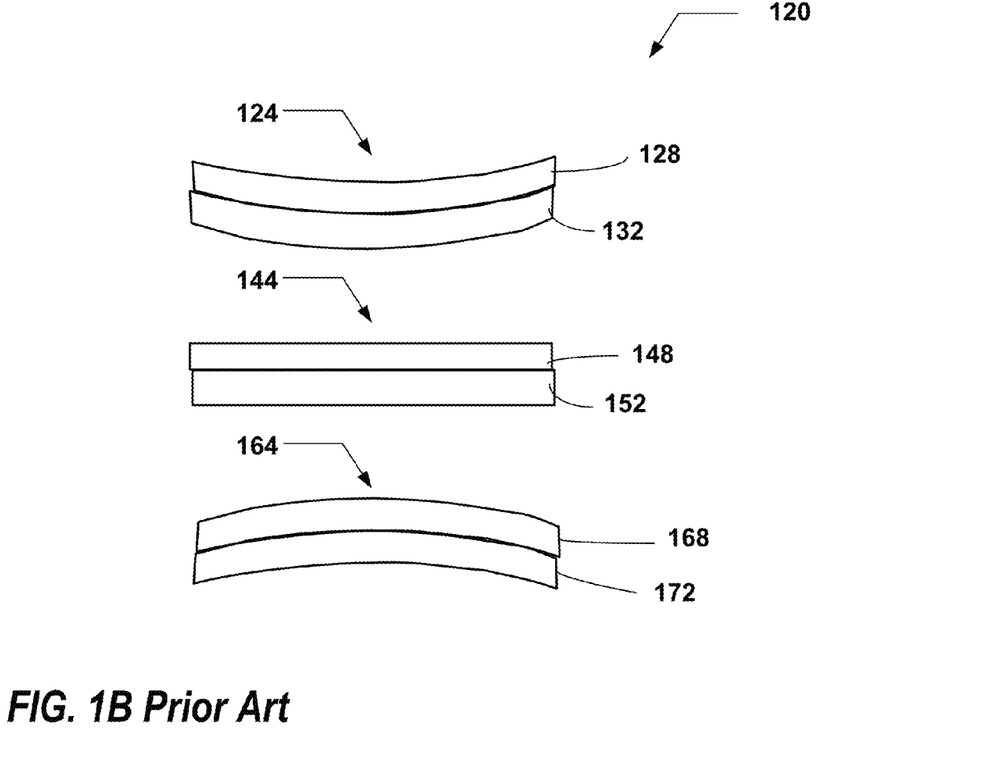
FIG. 1B depicts an exemplary prior art cross-sectional view of material layers comprising compressive films and no-stress films after deposition or curing.

FIG. 1B depicts exemplary prior art cross-sectional views 120 of layers of compressive films and no-stress films after deposition or curing. In a compressive film-forming system (not shown) 124, the compressive film layer 128 is formed above the substrate 132. The chuck (not shown) is substantially flat, i.e. with a degree of concavity of zero; consequently, compressive film 128 has a concave shape but has no tensile stress. In a similar film-forming system 144, the no-stress film layer 148 is formed above the substrate 152 in a substantially flat shape but without tensile stress after a deposition or curing process is completed. In a similar film-forming system 164, the compressive film layer 168 is formed above the substrate 172 where the compressive film has a convex shape but has no tensile stress after the deposition or curing process is completed.

Figure 2A:
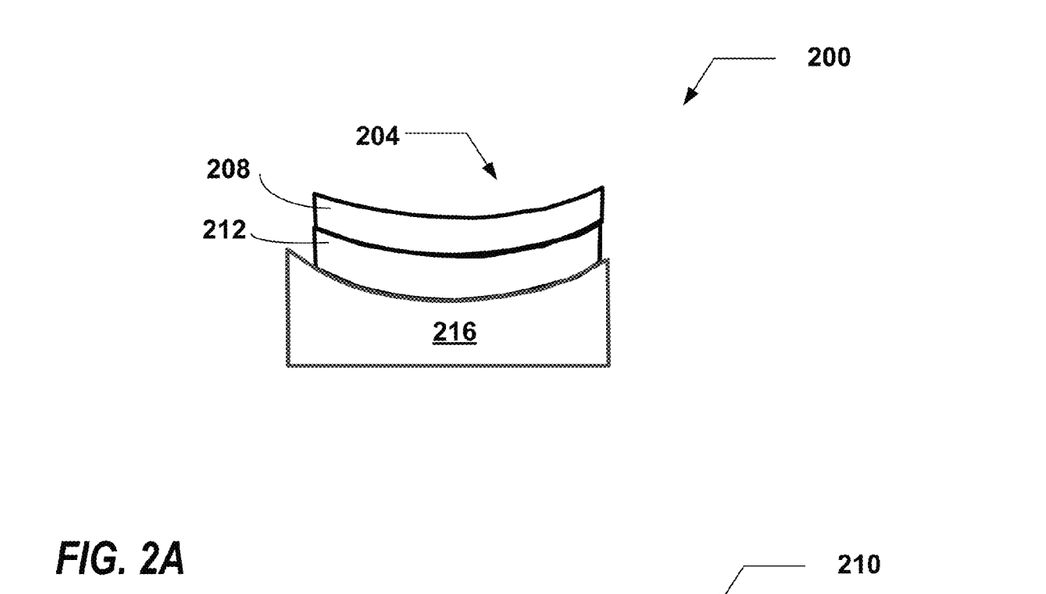
Figure 2B:
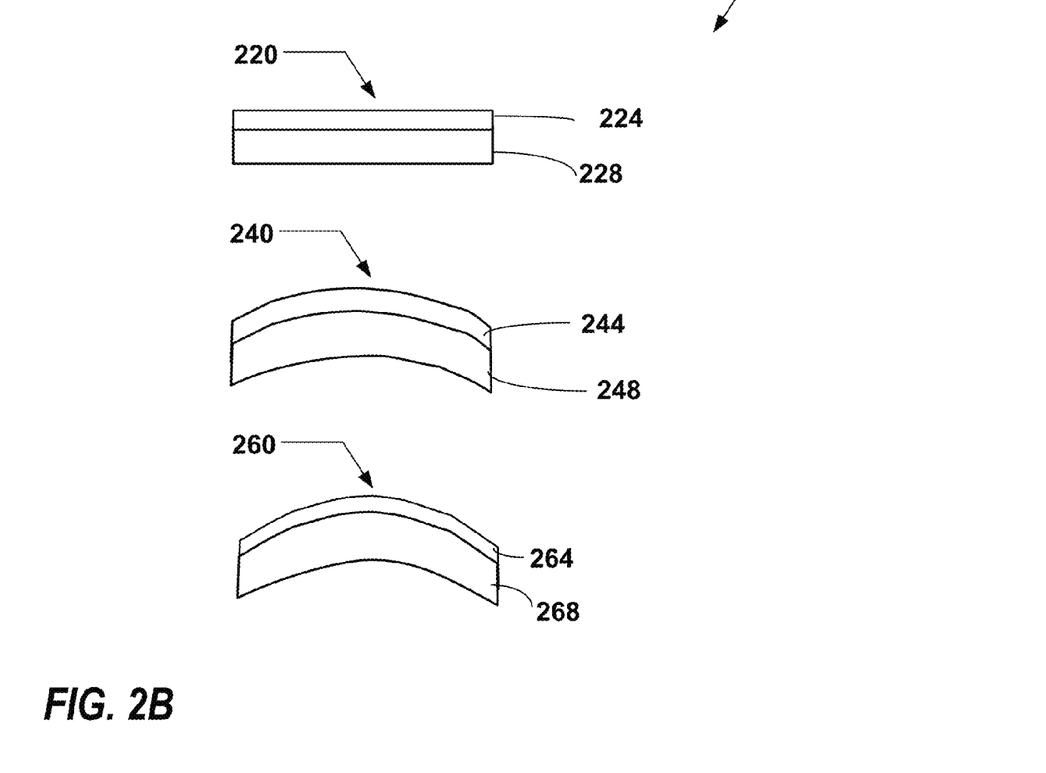
FIG. 2B depicts an exemplary cross-sectional view of layers for compressive films and no-stress films after deposition or curing using line roughness reduction techniques in an embodiment of the present invention.

FIG. 2A depicts an exemplary cross-sectional view 200 of a film-forming system (not shown) 204 and a layer 208 of a substrate 212 during deposition or curing. The layer 208 of material is formed over the substrate 212 on top of the chuck 216, the chuck 216 having a concave surface. FIG. 2B depicts exemplary cross-sectional views 210 of layers for compressive films and no-stress films after deposition or curing using techniques in an embodiment of the present invention. A compressive film 224 on a substrate 228 in a film-forming system (not shown) 220 is shown where the compressive film 224 and substrate are flexed to maintain compressive stress on the film 224. A no stress film 244 on a substrate 248 in a film-forming system (not shown) 240 is shown where the no stress film 244 and substrate are flexed to create compressive stress on the film 244 during or after the deposition or curing of the substrate 248. A tensile stress film 264 on a substrate 268 in film-forming system (not shown) 260 is shown where the tensile film 264 and substrate 268 are flexed to create compressive stress on the film 264 during or after the deposition or curing of the substrate 268. After the flexing operation, the films 224 244 and 264 are unflexed to induce tensile stress in the films 224, 244 and 264.

Figure 3A:
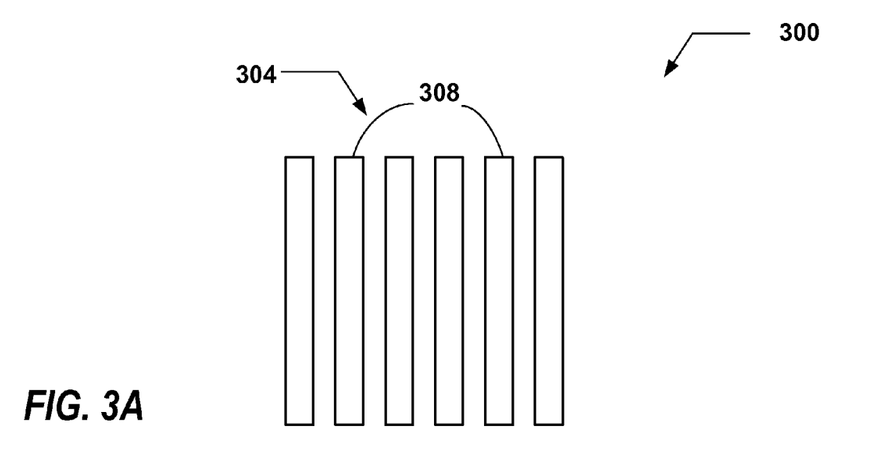
Figure 3B:
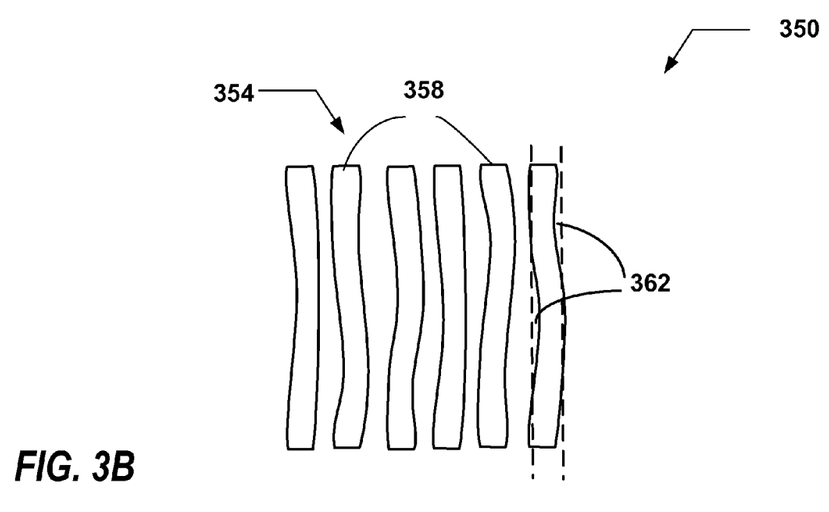
FIG. 3B is an exemplary top view of structures in a compressive stress layer on a substrate.

FIG. 3A depicts an exemplary top-view 300 of structures 308 in a tensile to a neutral stress layer 304 after using the techniques of reducing line roughness in an embodiment of the present invention. FIG. 3B is an exemplary top view 350 in a compressive stress layer 354 on a substrate 362. Due to the compressive stress on the film 354, the structures 358 are "wiggly" instead of being straight as in an ideal or close to ideal line-and-space pattern. Using the techniques of the present invention of flexing by causing a degree of concavity on the substrate 362 during or after the deposition or curing of the substrate 362, and unflexing the substrate 362 to induce a target tensile stress on the substrate, the line roughness can be reduced. The line roughness can be reduced by up to 2 nm of 3σ of the deviation. Unflexing the substrate 362 comprises removal of the cause of concavity on the substrate, reduction in the concavity of the substrate, change to a lower temperature, or change of a variable, for example, from a high vacuum state during the flexing to a lower vacuum state after the flexing is complete. Removal of the cause of concavity on the substrate can include lowering the power used in an electrostatic chuck or as mentioned above, lowering the vacuum state of a vacuum chuck. Other factors such as changes to the density of film or changes of the film material may also cause a change in tensile stress on the film on the substrate.

Figure 4A:
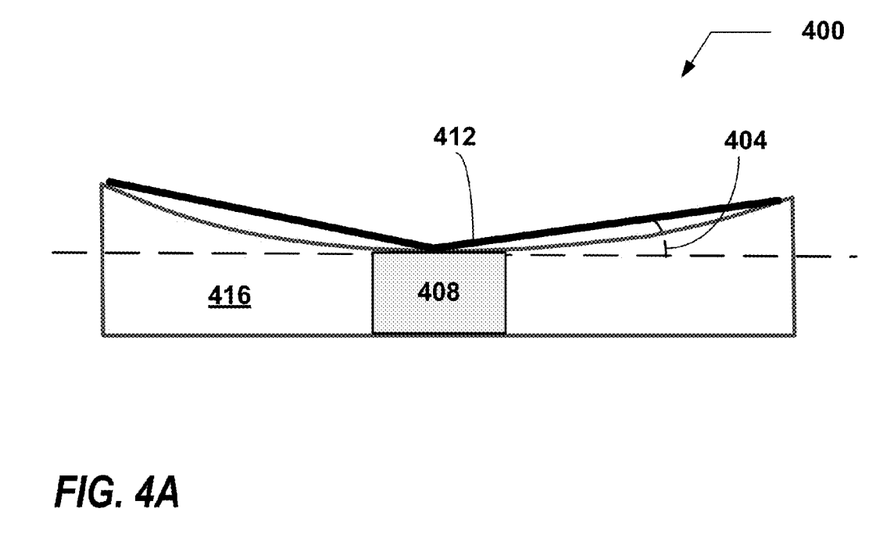
Figure 4B:
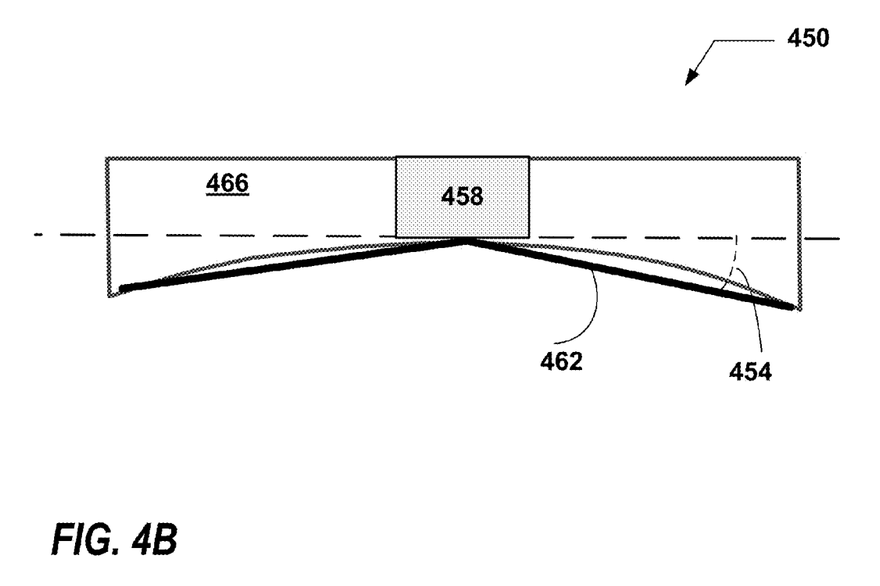
FIG. 4B depicts a schematic of a substrate on a concave chuck and a clamping device illustrating the degree of concavity with the substrate disposed below the chuck.

FIG. 4A depicts a schematic 400 of a substrate 412 on a concave chuck 416 and a clamping device 408 illustrating the degree of concavity 404 with the substrate 412 on top of the chuck 416. FIG. 4B depicts a schematic 450 of a substrate 462 on a concave chuck 466 and a clamping device 458 illustrating the degree of concavity 454 with the substrate 462 below the chuck 466. The degree of concavity can be a range of up to 300 microns for a 300 mm substrate. In another embodiment, the degree of concavity can be a range of 100 to 300 microns or a range that is greater than a base number of microns, where the base number of microns can be up to 100 microns. Alternatively, the degree of concavity can be up to 1 micron per millimeter of diameter of the substrate. In still another embodiment, the degree of concavity is varied according the diameter of the substrate and historical data for the application.

Figure 5A:
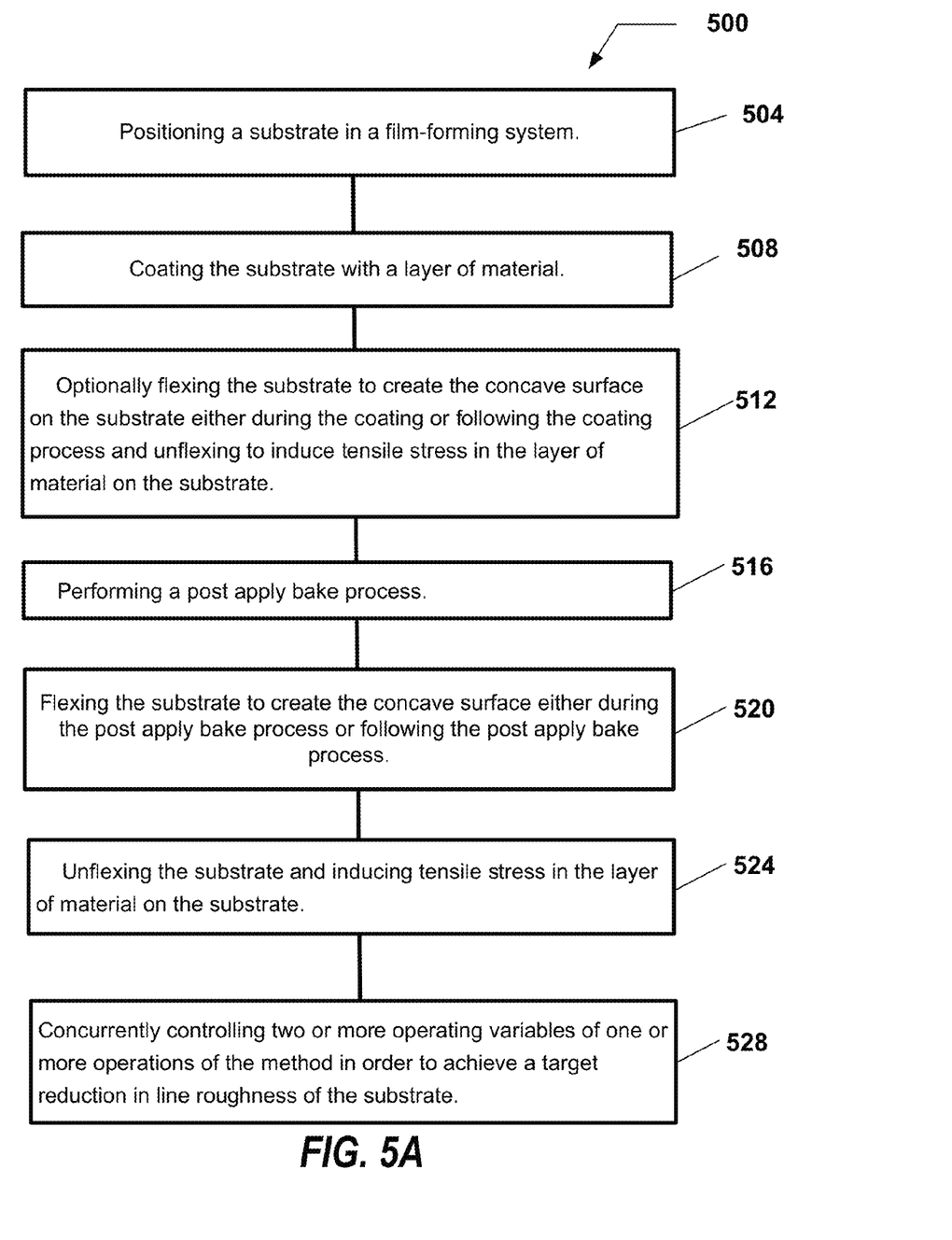
FIG. 5A is a flowchart for a method of improving the line roughness of a pattern using flexing techniques in an embodiment of the present invention.

FIG. 5A is a flowchart 500 for a method of improving the line roughness of a pattern using the techniques in an embodiment of the present invention. In operation 504, a substrate is positioned in a processing chamber of a film-forming system. The film-forming system can be a track system and the processing chamber can be one of a coating chamber or deposition chamber, a bake chamber, or a developing chamber. In operation 508, the substrate is coated with a layer of material using a deposition process. The material may be a photoresist or a conformal layer of material deposited on the substrate. In operation 512, the substrate is optionally flexed to create the concave surface on the substrate either during the coating or following the coating with the layer of material and unflexed to induce tensile stress in the layer of material on the substrate. The option to perform this operation or not depends on the historical data acquired for processing the specific layer of material and other ranges of operating variables such as chamber temperature, pressure, and deposition technique used.

In operation 516, a post apply bake process is performed, which is a process that is known in the art for photoresist or conformal layer depositions. In operation 520 the substrate is flexed to create the concave surface on the substrate either during the post apply bake or following the post apply bake process. The flexing of the substrate causes a degree of concavity measured at the center of the substrate. Flexing of the substrate causes the layer of material above the substrate to have compressive stress. In operation 524, the substrate is unflexed and tensile stress is induced in the layer of material on the substrate. Flexing and unflexing operations are described in more detail above. In operation 528, two or more operating variables of one or more operations of the method are concurrently controlled in order to achieve a target reduction in line roughness of the substrate, which can be 4 to 6 nm of 3σ of the line roughness. The two or more operating variables can include chamber temperature, chamber pressure, degree of concavity, duration of flexing operation, and the like.

Figure 5B:
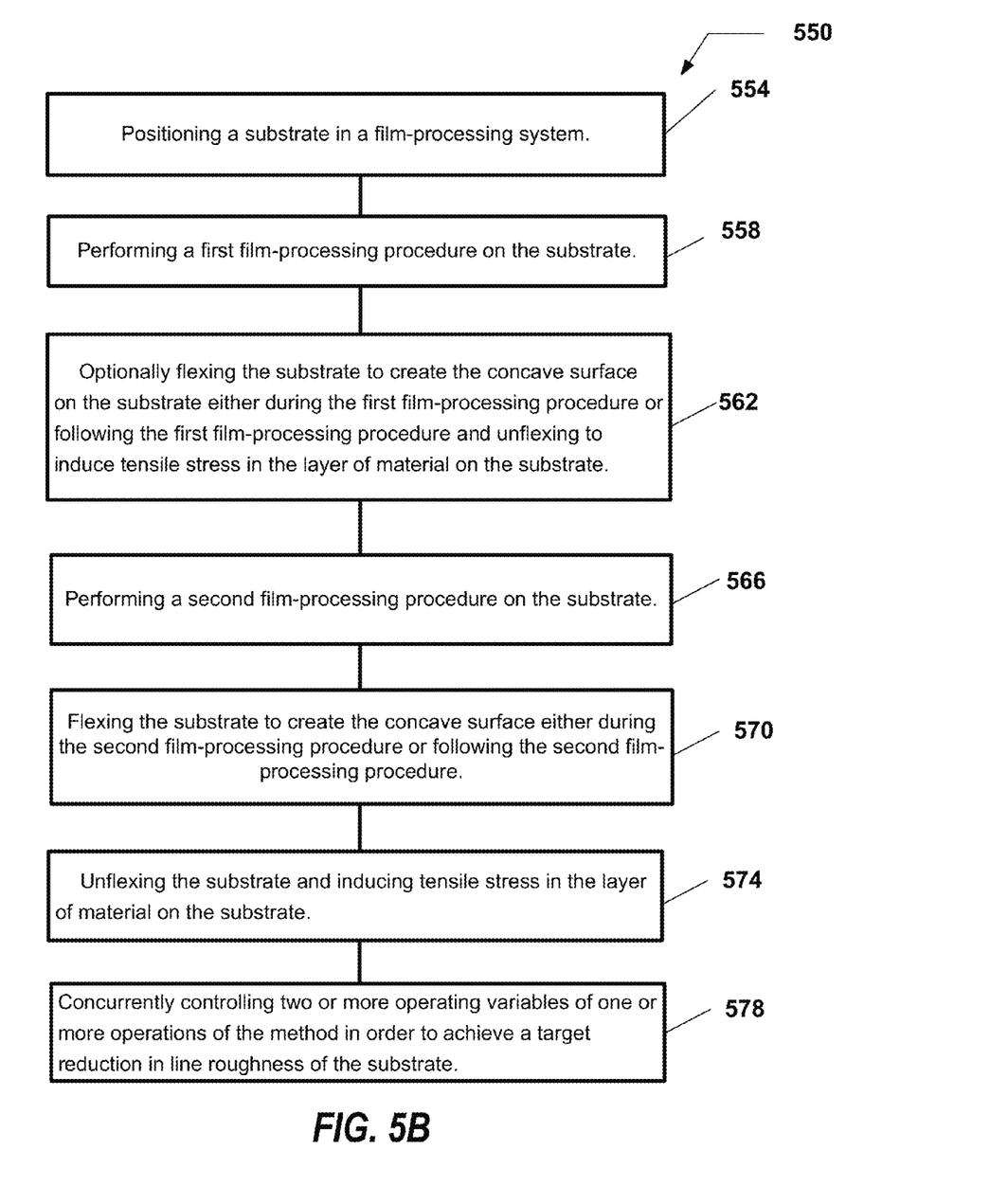
FIG. 5B is a flowchart for a method of improving the line roughness of a pattern using flexing techniques in another embodiment of the present invention.

FIG. 5B is a flowchart 550 for a method of improving the line roughness of a pattern using the techniques in an embodiment of the present invention. In operation 554, a substrate is positioned in a processing chamber of a film-processing system. The film-processing system can be a track system and the processing chamber can be one of a deposition chamber, a bake chamber, or a developing chamber. In operation 558, a first film-processing procedure is performed on the substrate where the first film-processing procedure can be an exposure or development procedure. In operation 562, the substrate is optionally flexed to create the concave surface on the substrate either during the first film-processing procedure or following the first film-processing procedure with the layer of material and unflexed to induce tensile stress in the layer of material on the substrate. The option to perform this operation or not depends on the historical data acquired for processing the specific layer of material and other ranges of operating variables such as chamber temperature, pressure, and deposition technique used.

In operation 566, a second film-processing procedure is performed, which can be a post exposure bake or post develop bake procedure. In operation 570, the substrate is flexed to create the concave surface on the substrate either during the second film-processing procedure or following the second film-processing procedure. The flexing of the substrate causes a degree of concavity measured at the center of the substrate. Flexing of the substrate causes the layer of material above the substrate to have compressive stress. In operation 574, the substrate is unflexed and tensile stress is induced in the layer of material on the substrate. Flexing and unflexing operations are described in more detail above. In operation 578, two or more operating variables of one or more operations of the method are concurrently controlled in order to achieve a target reduction in line roughness of the substrate, which can be 4 to 6 nm of 3σ of the line roughness. The two or more operating variables can include chamber temperature, chamber pressure, degree of concavity, duration of flexing operation, and the like.

In order to establish the degree of concavity on the substrate, film stress measurements must be conducted. One film stress measurement technique includes (a) measuring the curvature of the substrate prior to deposition or curing and (b) measuring the substrate along the same trace after a film is applied. In one version of stress measurement analysis, the bending plate method is used to calculate stress in a deposited thin film layer, based upon the change in curvature and material properties of the film and substrate.

The difference between stress calculated using the curvature data prior to the deposition or curing and the stress calculated using the curvature data after the deposition or curing is the induced film stress. Negative values of stress are compressive (convex surface); positive values are tensile (concave surface). The units of stress are dynes/cm$^2$ (1 dyne $=10^{-5}$ Newton). As mentioned above, the applications of the present invention includes line roughness reduction for deposition, second application bake, second exposure bake, development, or deposition of spacer layer or photoresist layer processes. Other methods of calculating the radius of curvature or degree of concavity can also be used. For more information on thin film stress measurement using a stylus profiler, refer to Veeco Instruments Inc., 2650 E. Elvira Road, Tucson, Ariz. 85706 USA, or access www.veeco.com or other similar vendors.

Figure 6:
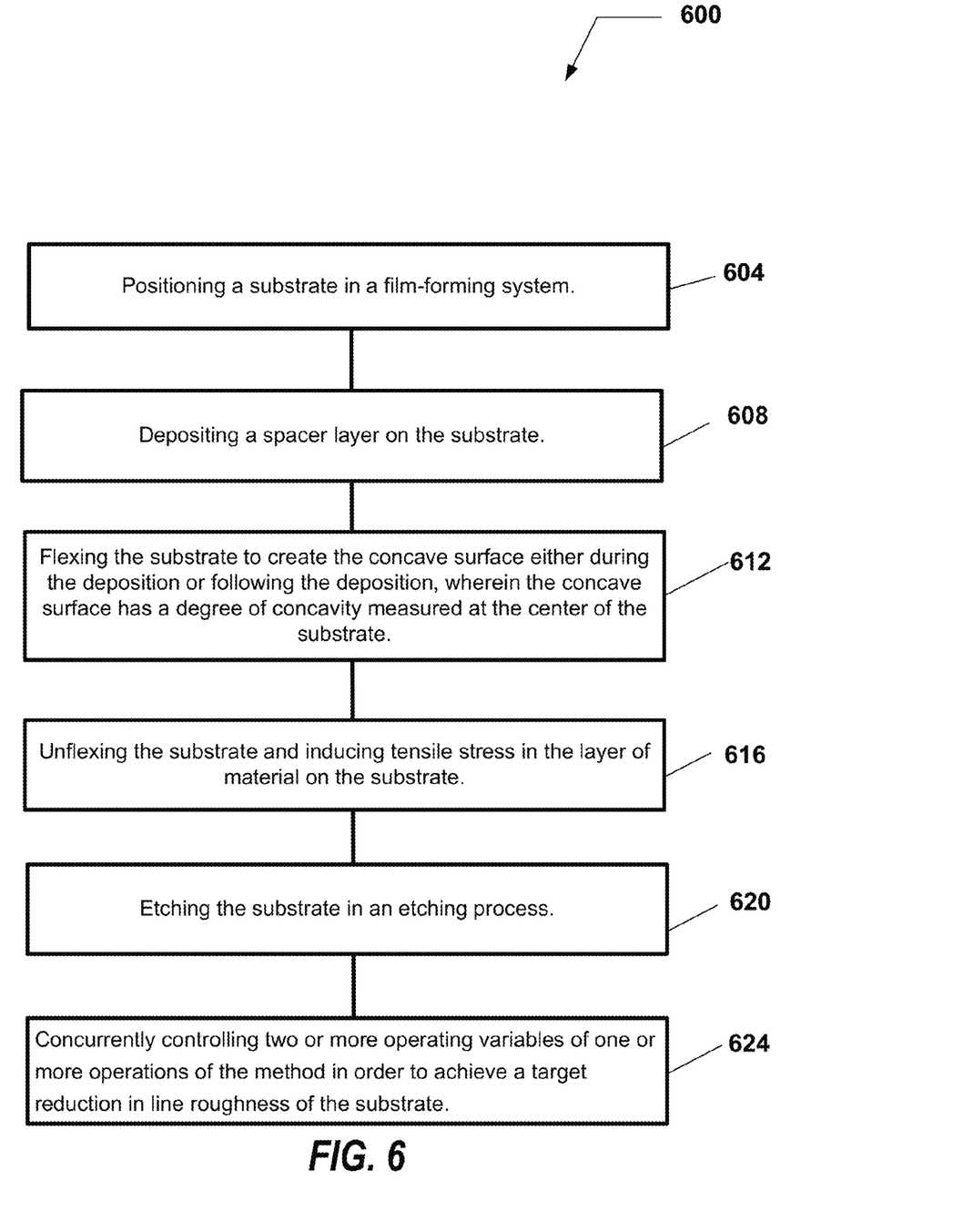
FIG. 6 is a flowchart for a method of improving the line roughness of a pattern using flexing techniques in yet another embodiment of the present invention.

FIG. 6 is a flowchart 600 for a method of improving the line roughness of a pattern using line roughness reduction techniques in another embodiment of the present invention. In operation 604, a substrate is positioned in a film-forming system. In operation 608, a spacer layer is deposited on the substrate. In operation 612, the substrate is flexed to create the concave surface either during the deposition of the spacer layer or following the deposition of the spacer layer, wherein the concave surface has a degree of concavity measured at the center of the substrate. In operation 616, the substrate is unflexed and tensile stress is induced in the layer of material on the substrate. In operation 620, the spacer layer on the substrate undergoes an etching process. In operation 624, two or more operating variables of one or more operations of the method are concurrently controlled in order to achieve a target reduction in line roughness of the substrate, which can be 4 to 6 nm of 3σ of the line roughness. The two or more operating variables can include chamber temperature, chamber pressure, degree of concavity, duration of flexing operation, and the like.

Figure 7A:
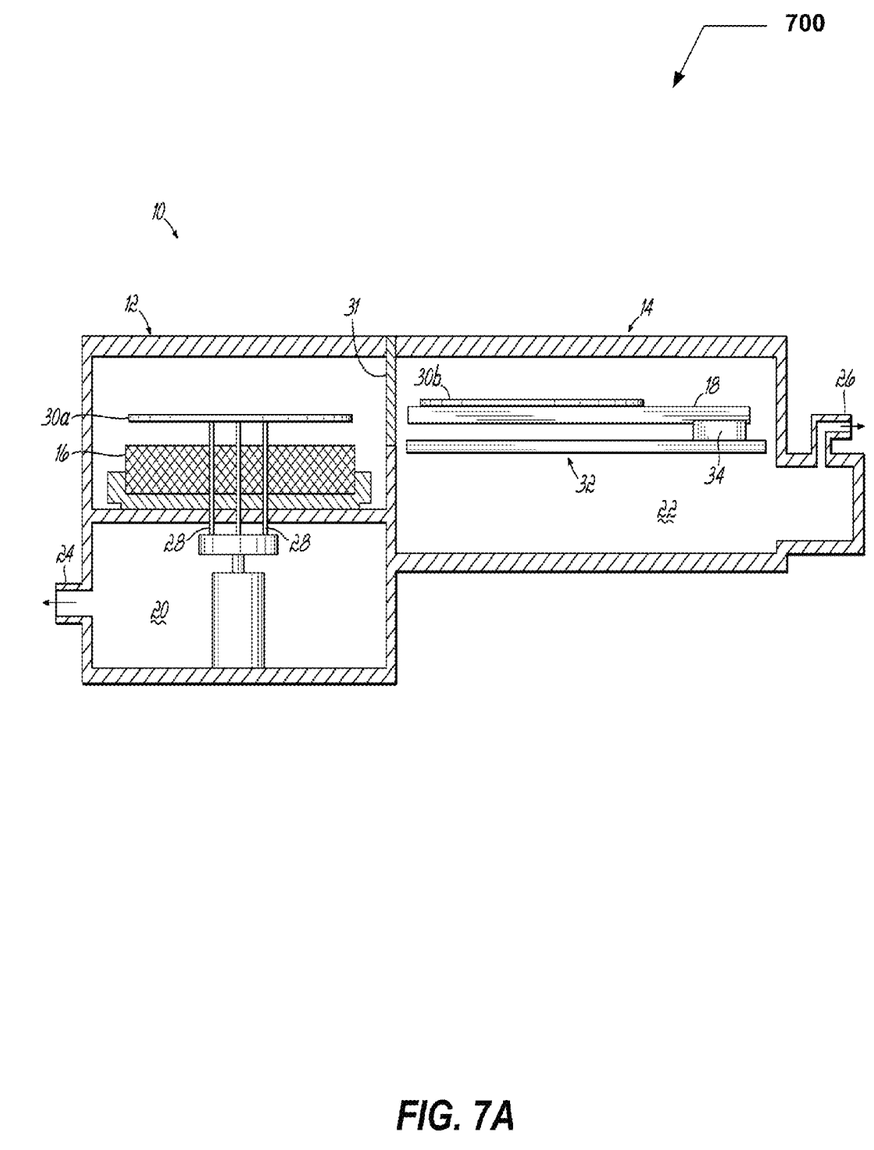
Figure 7B:
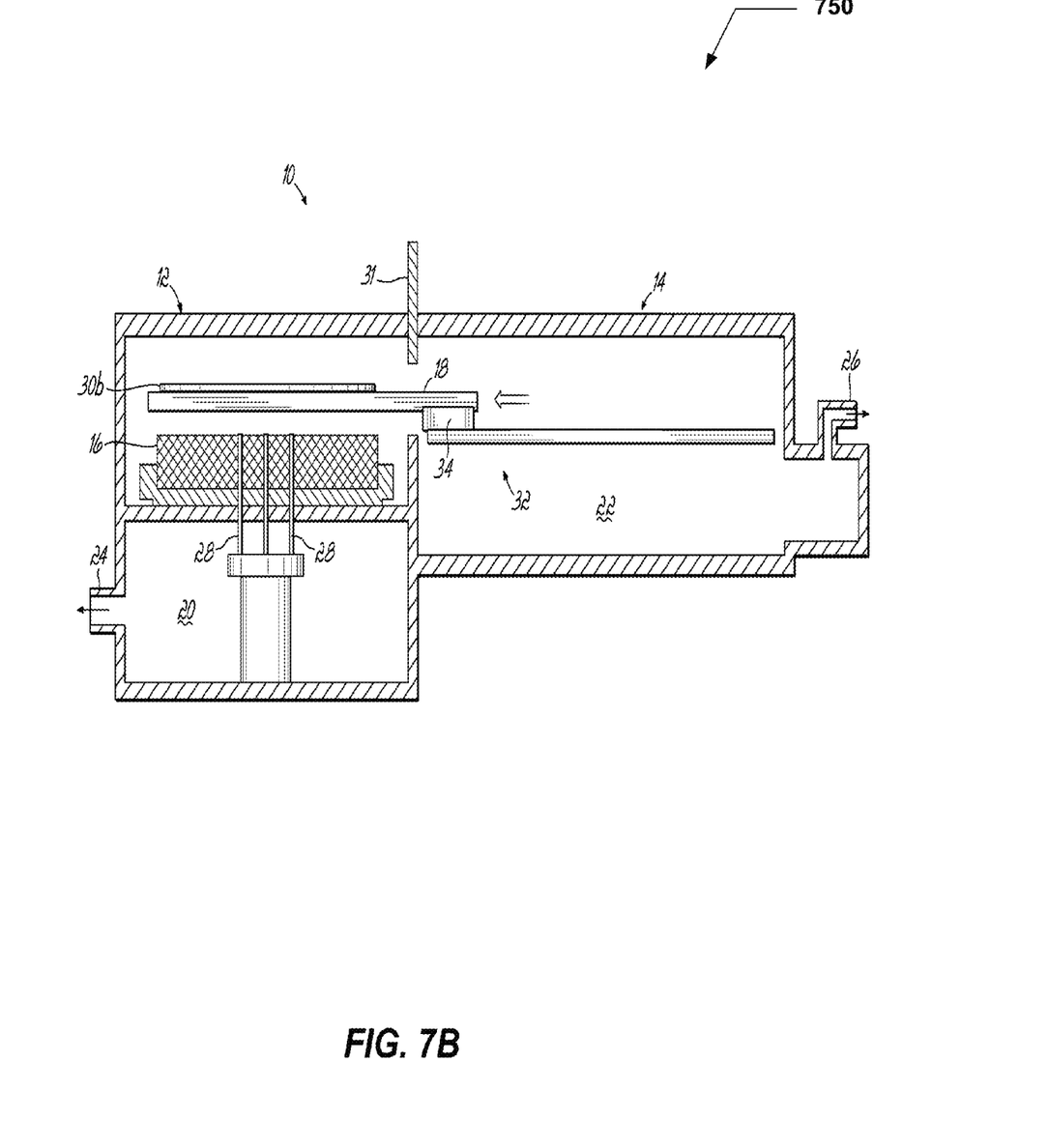
FIG. 7B depicts a schematic for a film-forming system for improving the line roughness utilizing the techniques of the present invention using a substrate in the heating chamber.

FIG. 7A depicts a schematic 700 for a film-forming system for improving the line roughness utilizing the techniques of the present invention using a substrate in a cooling chamber 12. FIG. 7B depicts a schematic 750 for a film-forming system for improving the line roughness utilizing the techniques of the present invention using a substrate in a heating chamber 14. Referring to FIG. 7A, a processing system 10 suitable for use with embodiments of the present invention is shown. Generally, the system 10 includes a heating chamber 12 and a cooling chamber 14, each having a substrate support 16, 18 therein, configured to support and heat or cool a substrate 30b positioned thereon. The substrate support 16 is also referred to as a heating plate 16, and substrate support 18 is also referred to as a chilling plate. As used herein, the substrate 30b may refer to any structure providing a "substrate" in the fabrication of one or more semiconductor devices. Each of the heating and cooling chambers 12, 14 includes an exhaust chamber 20, 22 that is fluidically-coupled to a vacuum pump (not shown) via an exhaust port 24, 26. As shown, the heating and cooling chambers may be physically isolated from one another by a movable door 31 that is operationally coupled with the operation of a transfer mechanism 32, as discussed below.

The system 10 of FIGS. 7A and 7B includes a dedicated transfer mechanism 32 positioned within the cooling chamber 14 and having a transfer arm 34 configured to transfer the substrate 30b between a home position within the cooling chamber 14, as shown in FIG. 7A and a transfer position above the heating plate 16, as shown in FIG. 7B. In this way, the substrate 30a may be transferred between the heating plate 16 and the chilling plate 18 as necessary and in accordance with a particular processing method. More specifically, the substrate 30a supported by the heating plate 16 may be heated and then lifted, via lift pins 28, off the heating plate 16. The movable door 31 may be repositioned, provide an opening between the heating and cooling chambers 12, 14 to permit entry of the chilling plate 18 into the heating chamber 12. The transfer arm 34 moves the chilling plate 18 to the transfer position such that the lift pin 28 may lower the substrate 30b onto the chilling plate 18. Thereafter, the transfer arm 34 withdraws the chilling plate 18 with the substrate 30b to the home position so the substrate 30b may be cooled. Although the illustrated cooling system 14 is shown with a chilling plate 18, the cooling chamber 14 may comprise at least one of a substrate chuck configured in fluid communication with a chiller unit, a thermoelectric device, or a gas inlet in fluid communication with a convective gas supply.

The system 10 may also include one or more feedback control mechanisms (not shown), such as analyzers, sensors, and controllers that monitor and adjust the atmospheres in the heating chamber, cooling chamber, and/or transfer area. For example, the feedback control mechanisms may be capable of making real-time adjustments with respect to temperature, power input to clamping device, vacuum level, pressure level, or degree of concavity.

Figure 8A:
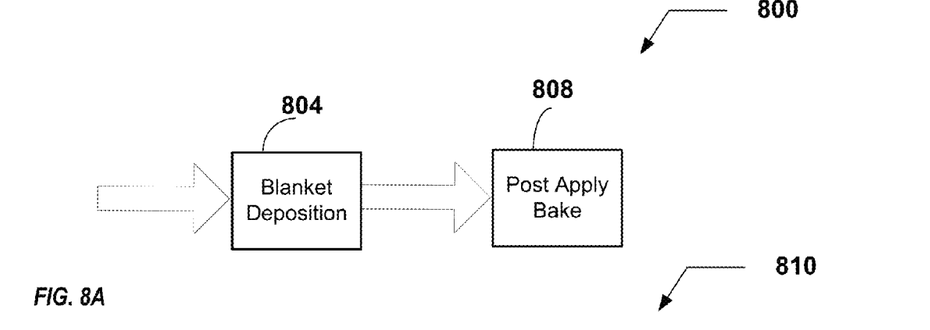
FIG. 8A depicts an integration sequence of process operations including a blanket deposition and a second apply bake (PAB) processes.

FIG. 8A depicts an integration sequence 800 of process operations including a blanket deposition 804 and a post apply bake (PAB) process 808. The blanket deposition process can include depositing a photosensitive material or a conformal layer over one or more layers on the substrate. The photosensitive material can be a photoresist or other material that is applied over the entire substrate. Flexing of the layer of material on the substrate can be performed during or after blanket deposition or coating of the substrate with the photosensitive or other material. After the flexing operation, an unflexing process is performed and tensile stress is induced on the substrate. A post apply bake 808 can be performed on the substrate after the unflexing process. Flexing of the substrate can be performed during or after the post apply bake 808. After the flexing operation, an unflexing process is performed on the substrate which induces tensile stress in the layer of material on the substrate. Flexing and unflexing operations are described in more detail above.

Figure 8B:
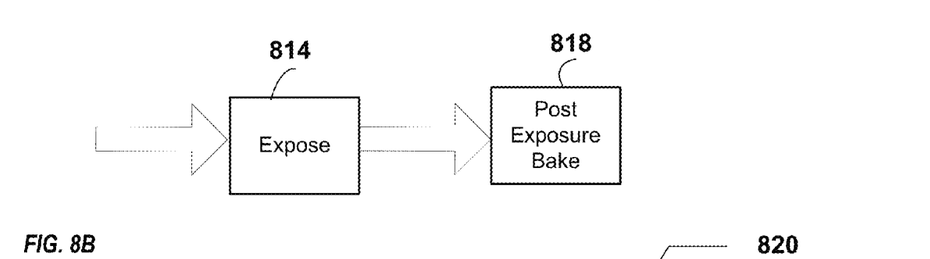
FIG. 8B depicts an integration sequence of processes including an exposure and a second exposure bake (PEB) processes.

FIG. 8B depicts an integration sequence 810 of processes including an exposure and a post exposure bake (PEB) processes. The exposure process 814 can include a traditional photoresist exposure in lithography. Post exposure bake 818 follows the exposure process 814. Flexing of the layer of material on the substrate can be performed during or after the post exposure bake 818 of the substrate. After the flexing operation, an unflexing process is performed and tensile stress is induced on the film on the substrate. Flexing and unflexing operations are described in more detail above.

Figure 8C:
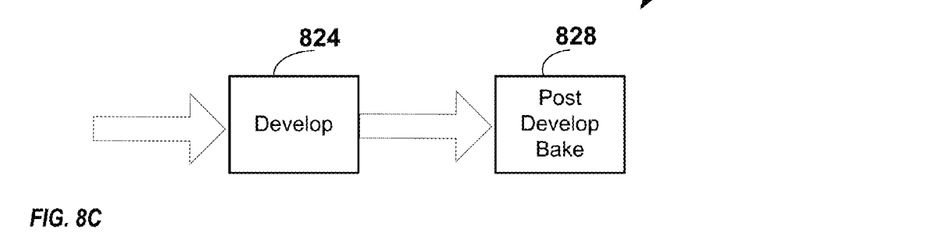
FIG. 8C depicts an integration sequence of process operations including a develop and a second develop bake (PDB) processes.

FIG. 8C depicts an integration sequence 820 of process operations including a develop 824 and a post develop bake (PDB) 828 processes. The develop process 824 can include a traditional develop process in lithography. Post develop bake 828 follows the exposure process 824. Flexing of the layer of material on the substrate can be performed during or after the post develop bake 828 of the substrate. After the flexing operation, an unflexing process is performed and tensile stress is induced on the film on the substrate. Flexing and unflexing operations are described above. Another integration sequence can include the integration sequence described in relation to FIG. 8A, followed by the integration sequence described in relation to FIG. 8B, and followed by the integration sequence described in relation to FIG. 8C. Other variations of the aforementioned integration sequence can also be done.

Figure 8D:
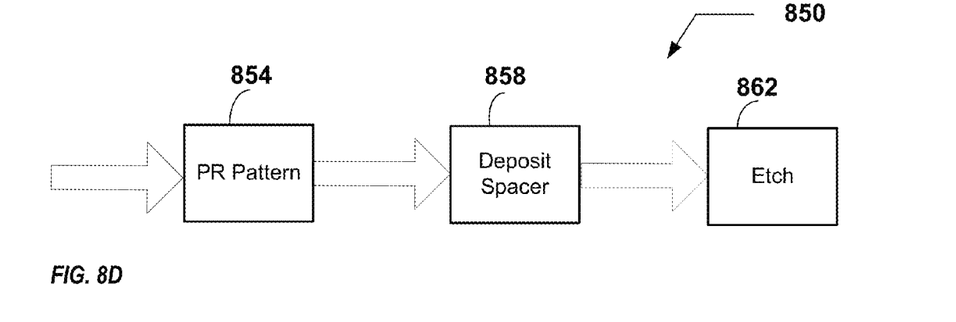
FIG. 8D depicts an integration sequence of process operations including a photoresist patterning, spacer deposition, and etch processes, utilizing the line roughness reduction techniques of the present invention.

FIG. 8D depicts an integration sequence 850 of process operations including a photoresist patterning 854, spacer deposition 858, and etch processes 862, utilizing the line roughness reduction techniques of the present invention. The photoresist patterning process 854 can include a traditional photoresist patterning process in lithography that is well known in the art. Deposition of the spacer 858 follows the photoresist patterning process 854. An etch process 862 follows which removes the material around the spacer in processes well known in the art. Flexing of the layer of material on the substrate can be performed during or after the deposition of the spacer 858 of the substrate. After the flexing operation, an unflexing process is performed and tensile stress is induced on the film on the substrate. Flexing and unflexing operations are described above.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of preparing a thin film, comprising: receiving a substrate having a layer of photoresist applied on the substrate; performing a post application bake process; flexing the substrate to create a concave surface either during the post application bake process or following the post application bake process, wherein the concave surface has a degree of concavity measured at the center of the substrate that exceeds a target, non-zero deflection; and unflexing the substrate and inducing tensile stress in the layer of photoresist on the substrate.

2. The method of claim 1 wherein:
the degree of concavity ranges up to 300 microns for a 300 mm substrate.

3. The method of claim 1 wherein:
the degree of concavity ranges from 100 microns to 200 microns or wherein the degree of concavity is less than 1 micron per millimeter of diameter of the substrate.

4. The method of claim 1 wherein: the degree of concavity is selected and varied according the diameter of the substrate and historical data acquired for processing the layer of photoresist.

5. The method of claim 1, wherein the method of preparing the thin film utilizes a track system coupled to a processing chamber, and wherein the processing chamber is one of a coating chamber, a bake chamber, or a developing chamber, or the film-forming system is at least one of a spin-on coating chamber or a vapor deposition chamber.

6. The method of claim 1, further comprising concurrently controlling two or more operating variables of one or more operations of the method in order to achieve a target reduction in line roughness of the substrate.

7. A method for processing a semiconductor substrate to reduce line roughness, the method comprising: positioning a substrate in a film-processing system, the film-processing system comprising a chuck having a clamping mechanism configured to hold the substrate in a processing chamber and flex the substrate by displacing a center of the substrate relative to a peripheral edge of the substrate so as to create a concave surface during processing, the substrate having a layer of photoresist; performing a first film-processing procedure on the substrate; performing a second film-processing procedure on the substrate; flexing the substrate to create the concave surface either during the second film-processing procedure or following the second film-processing procedure, wherein the concave surface has a degree of concavity measured at the center of the substrate that exceeds a base number of microns; and unflexing the substrate and inducing tensile stress in the layer of photoresist on the substrate.

8. The method of claim 7, wherein the first-film processing procedure is an exposure process.

9. The method of claim 8 wherein the second film-processing procedure is a post exposure bake procedure.

10. The method of claim 7, wherein the first-film processing procedure is a development process.

11. The method of claim 10 wherein the second film-processing procedure is a post develop bake procedure.

12. The method of claim 7:
wherein the degree of concavity is modified by the clamping mechanism of the chuck;
wherein the clamping mechanism utilizes an electrostatic device to modify the degree of concavity;
or wherein the clamping mechanism utilizes a vacuum device to modify the degree of concavity.

13. The method of claim 7 wherein: the degree of concavity is selected and varied according the diameter of the substrate and historical data acquired for processing the layer of photoresist.

14. The method of claim 7, further comprising concurrently controlling two or more operating variables of one or more operations of the method in order to achieve a target reduction in line roughness of the substrate.

15. A method for processing a semiconductor substrate, the semiconductor having a structure, the structure having a line roughness, the method configured to improve line roughness, the method comprising: positioning a substrate in a track system, the track system comprising a chuck having a clamping mechanism configured to hold the substrate in a processing chamber and flex the substrate by displacing a center of the substrate relative to a peripheral edge of the substrate so as to create a concave surface during processing, the substrate having a layer of photoresist; depositing a spacer layer on the substrate, the deposition generating a spacer pattern on the substrate; flexing the substrate to create the concave surface either during the deposition or following the deposition of the spacer layer, wherein the concave surface has a degree of concavity measured at the center of the substrate that exceeds a base number of microns; and unflexing the substrate and inducing tensile stress in the layer of photoresist on the substrate.

16. The method of claim 15 wherein: the degree of concavity is from a range of 150 to 200 μm or the degree of concavity is less than 1 micron per millimeter of diameter length of the substrate, or the degree of concavity is varied according the diameter of the substrate and historical data acquired for processing the layer of photoresist.

17. The method of claim 16 wherein a target reduction in the line roughness is 4 to 6 nm of 3 sigma ($3\sigma$) or wherein the line roughness includes line edge roughness and line width roughness.

18. The method of claim 15 further comprising:
performing an etch process on the spacer pattern on the substrate;
flexing the substrate to create the concave surface either during the etch process or following the etch process, wherein the concave surface has a degree of concavity measured at the center of the substrate that exceeds a base number of microns; and
unflexing the substrate and inducing tensile stress in the spacer pattern on the substrate.

19. The method of claim 15, further comprising concurrently controlling two or more operating variables of one or more operations of the method in order to achieve a target reduction in line roughness of the substrate;
wherein the two or more operating variables include chamber temperature, degree of concavity, and/or duration of flexing operation.

* * * * *

UNITED STATES PATENT AND TRADEMARK OFFICE
CERTIFICATE OF CORRECTION

| | | |
|---|---|---|
| PATENT NO. | : 9,508,557 B2 | Page 1 of 1 |
| APPLICATION NO. | : 14/676356 | |
| DATED | : November 29, 2016 | |
| INVENTOR(S) | : Kang | |

It is certified that error appears in the above-identified patent and that said Letters Patent is hereby corrected as shown below:

In the Specification

Column 2, Line 6, delete "varied according the diameter" and insert --varied according to the diameter--.

Column 4, Line 3, delete "layer of material which is" and insert --layer of material, which is--.

Column 4, Line 21, delete "on the substrate 108 that is disposed" and insert --on the substrate 108 is disposed--.

Column 5, Line 35, delete "is varied according the diameter" and insert --is varied according to the diameter--.

In the Claims

Column 9, Line 35, Claim 4, delete "varied according the diameter" and insert --varied according to the diameter--.

Column 9, Line 65, Claim 8, delete "wherein the first-film" and insert --wherein the first film--.

Column 10, Line 3, Claim 10, delete "wherein the first-film" and insert --wherein the first film--.

Column 10, Line 15, Claim 13, delete "varied according the diameter" and insert --varied according to the diameter--.

Column 10, Line 43, Claim 16, delete "according the diameter" and insert --according to the diameter--.

Signed and Sealed this
Twenty-eighth Day of March, 2017

Michelle K. Lee
*Director of the United States Patent and Trademark Office*